US012730195B2

(12) United States Patent
Ain-Kedem et al.

(10) Patent No.: US 12,730,195 B2
(45) Date of Patent: Sep. 8, 2026

(54) LIGHT DETECTION AND RANGING SYSTEMS

(71) Applicant: Intel Corporation, Santa Clara, CA (US)

(72) Inventors: Liron Ain-Kedem, Kiryat Tivon (IL); Gilad Rahamim, Ramat Gan (IL); Ahuva Kroizer, Jerusalem (IL); Avi Medlinsky, Ramat Yishay (IL)

(73) Assignee: Intel Corporation, Santa Clara, CA (US)

(*) Notice: Subject to any disclaimer, the term of this patent is extended or adjusted under 35 U.S.C. 154(b) by 440 days.

(21) Appl. No.: 18/552,927

(22) PCT Filed: Mar. 18, 2022

(86) PCT No.: PCT/US2022/020843
§ 371 (c)(1),
(2) Date: Sep. 28, 2023

(87) PCT Pub. No.: WO2022/250765
PCT Pub. Date: Dec. 1, 2022

(65) Prior Publication Data

US 2024/0192332 A1 Jun. 13, 2024

Related U.S. Application Data

(60) Provisional application No. 63/194,230, filed on May 28, 2021.

(51) Int. Cl.
*G01S 7/481* (2006.01)
*G01R 19/00* (2006.01)
(Continued)

(52) U.S. Cl.
CPC ........ *G01S 7/4817* (2013.01); *G01R 19/0092* (2013.01); *G01S 7/4815* (2013.01);
(Continued)

(58) Field of Classification Search
None
See application file for complete search history.

(56) References Cited

U.S. PATENT DOCUMENTS 9,812,838 B2 11/2017 Villeneuve et al.
11,119,219 B1 * 9/2021 LaChapelle .............. G02B 6/12
(Continued)

FOREIGN PATENT DOCUMENTS

KR 20200022394 A1 3/2020
WO 2018055449 A2 3/2018
WO 2020242834 A1 12/2020

OTHER PUBLICATIONS

International search report issued for the corresponding international patent application No. PCT/US2022/020843, dated Jul. 6, 2022, 4 pages (for informational purposes only).

*Primary Examiner* — Mohammad J Rahman
(74) *Attorney, Agent, or Firm* — Viering, Jentschura & Partner mbB

(57) ABSTRACT

A light detection and ranging system is provided. The light detection and ranging system includes a LIDAR scanning mirror; a processor configured to control the LIDAR scanning mirror; a first position sensor configured to determine a first position and a second position sensor configured to detect a second position of the LIDAR scanning mirror. The processor is configured to determine whether an eye-safety criterion is met based on the first position and the second position, and control light output of the LIDAR system based on whether the eye-safety criterion is met.

20 Claims, 6 Drawing Sheets

(51) Int. Cl.
*G01S 7/497* (2006.01)
*G01S 17/931* (2020.01)

(52) U.S. Cl.
CPC ............ *G01S 7/4816* (2013.01); *G01S 7/497* (2013.01); *G01S 17/931* (2020.01)

(56) References Cited

U.S. PATENT DOCUMENTS

| | | | | |
|---|---|---|---|---|
| 11,927,694 | B2 * | 3/2024 | Donovan ................ | G01S 7/484 |
| 12,235,362 | B2 * | 2/2025 | Moebius .............. | G02B 6/3548 |
| 2018/0284271 | A1 * | 10/2018 | Bogatscher ........... | G01S 7/4812 |
| 2019/0018121 | A1 * | 1/2019 | Sayyah ................. | G01S 7/4815 |
| 2019/0195992 | A1 | 6/2019 | Nabbe | |
| 2019/0302269 | A1 * | 10/2019 | Singer ................... | G01S 7/4818 |
| 2020/0217967 | A1 | 7/2020 | Stoschek et al. | |
| 2021/0055387 | A1 * | 2/2021 | LaChapelle ........... | G01S 7/4865 |

* cited by examiner

LIGHT DETECTION AND RANGING SYSTEMS

CROSS-REFERENCE

This is a national phase of PCT application PCT/US2022/020843, which was filed on Mar. 18, 2022, and which claims priority to U.S. provisional application 63/194,230, filed on May 28, 2021, the entirety of each of which is fully incorporated herein by reference.

TECHNICAL FIELD

This disclosure generally relates to the field of light detection and ranging systems.

BACKGROUND

Coherent light detection and ranging (LIDAR) systems are desirable for autonomous vehicles due to its inherent immunity to optical interference and ability to detect both the range and range-rate (relative velocity of a target) to a target. Notwithstanding these attributes, a coherent LIDAR system must still provide a long-range detection capability (>200 m) and a high data rate (>1M pixels/s) with high optical resolution (>100 vertical pixels) to be commercially viable.

LIDAR systems can be Class-I Laser products only due to eye safety mechanisms. Protective measures may be legally required if the LIDAR system has no eye safety mechanism. Hence, an eye safety mechanism is desirable for a safe LIDAR system containing product.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which.

DESCRIPTION

The following detailed description refers to the accompanying drawings that show, by way of illustration, specific details and aspects in which the invention may be practiced.

The term "as an example" is used herein to mean "serving as an example, instance, or illustration". Any aspect or design described herein as "as an example" is not necessarily to be construed as preferred or advantageous over other aspects or designs.

The described eye safety mechanisms are based on independent dual monitoring which enables stand-alone characterization and firmware (FW) based Build in Self-Test (BIST) as well as robustness for failures in the LIDAR system to properly cover the eye safety specification requirements.

The characterization of eye safety may be a key factor in mass production of LIDAR systems. The provided eye safety provisions can allow self-characterization of thresholds and response time without any additional provisions.

In addition, the provided eye safety provisions can have multi-layer output control which can allow optimal BIST with no or minimal output of optical power during the test.

Throughout this specification, a LIDAR system may be understood as a device configured to implement LIDAR sensing, and may include various components to carry out light emission, light detection, and data processing. A LIDAR system may include a light source (e.g., a laser source) and emitter optics (also denoted as optical components) to direct light into a field of view (FOV) of the LIDAR system (also denoted as scene of the LIDAR system), and may include receiver optics and a receiver (e.g. a photodetector) to collect and detect light from the field of view. The LIDAR system may further include a processing circuit configured to determine spatial information associated with the field of view of the LIDAR system based on the emitted light and the received light (e.g., the processing circuit may be configured to determine various properties of an object in the field of view based on the light that the LIDAR system emits and that the object reflects back towards the LIDAR system). Alternatively, or in addition, the LIDAR system may be communicatively coupled with a processing circuit external to the LIDAR system, e.g. with a cloud-based processing circuit. As examples, the processing circuit may be configured to determine the distance of an object from the LIDAR system, the shape of the object, the dimensions of the object, and/or the like. The LIDAR system may further include one or more additional components to enhance or assist the LIDAR sensing, such as, only as examples, a gyroscope, an accelerometer, a Global Positioning System (GPS) device, and/or the like. A LIDAR system may also be referred to herein as LIDAR device, LIDAR module, LIDAR means, or LIDAR apparatus.

Figure 1:
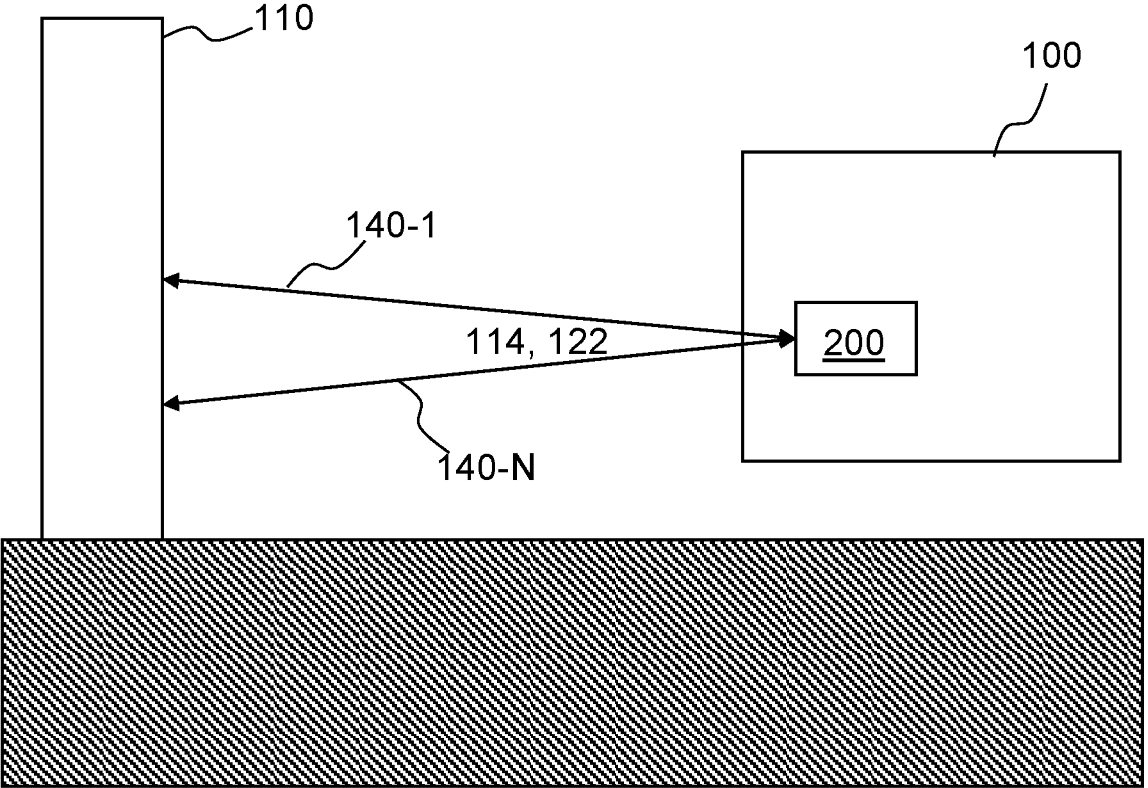
FIG. 1 illustrates a schematic diagram of a vehicle having a LIDAR system.

FIG. 1 illustrates a schematic diagram of a vehicle 100 having a LIDAR system 200 integrated therein, as an example. The vehicle 100 may be an unmanned/autonomous vehicle, e.g. unmanned/autonomous aerial vehicle, unmanned/autonomous automobile, or autonomous robot. In addition, the LIDAR system 200 may be used in a mobile device such as a smartphone or tablet. In a vehicle 100, the LIDAR system 200 may be used to control the direction of travel of the vehicle 100. Alternatively, or in addition, the LIDAR system 200 may be configured for obstacle detection, object depth detection or velocity detection outside of the LIDAR system 200 (also denoted as the scene of the LIDAR system 200), as an example. Alternatively, or in addition, the vehicle 100 may require a driver or teleoperator to control the direction of travel of the vehicle 100. Here, the LIDAR system 200 may be a driving assistant. As an example, the LIDAR system 200 may be configured for obstacle detection, e.g. determining a distance and/or direction and relative velocity of an obstacle (target 110) outside of the vehicle 100. The LIDAR system 200 may be configured, along one or more optical channels 140-*i* (with i being one between 1 to N and N being the number of channels of the PIC), to emit light 114 from one or more outputs (also denoted as Rx) of the LIDAR system 200, e.g. outputs of the light paths, and to receive light 122 reflected from the target 110 in one or more light inputs (also denoted as Tx) of the LIDAR system 200. The structure and design of the outputs and inputs of the light paths of the LIDAR system 200 may vary depending on the working principle of the LIDAR system 200.

Alternatively, the LIDAR system 200 may be or may be part of a spectrometer or microscope. However, the working principle may be the same as in a vehicle 100.

Figure 2:
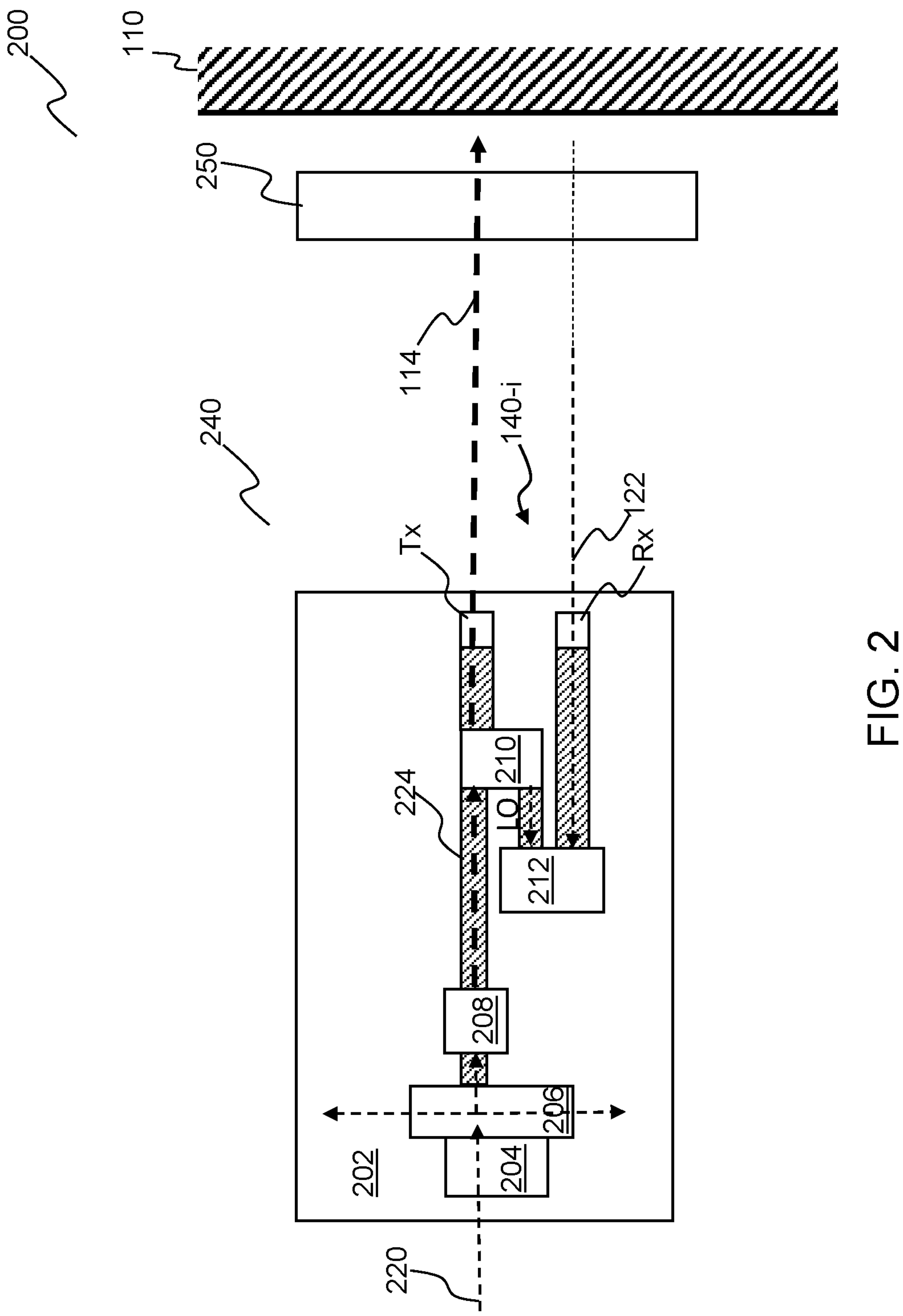
FIG. 2 illustrates a schematic diagram of a LIDAR system.

FIG. 2 illustrates a schematic diagram of a LIDAR system 200. The LIDAR system 200 includes a photonic integrated circuit (PIC) 240 on a PIC substrate 202, e.g. a semiconductor substrate, e.g. a silicon-based substrate.

The PIC substrate 202 may be made of a semiconductor material, e.g. silicon. The semiconductor photonic integrated circuit 202 may be common substrate, e.g. at least for a plurality of optical channels 140-*i*. The term "integrated therein" may be understood as formed from the material of the substrate and, thus, may be different to the case in which elements are formed, arranged or positioned on top of a substrate. The term "located next" may be interpreted as formed in or on the same (a common) PIC substrate 202.

Each optical channel (also denoted as light path) 140-*i* of the plurality of optical channels 140-N may include at least one optical output interface Tx configured to output the amplified light from the PIC 240. Each light path of the plurality of optical channels 140-N may include at least one photodetector 212 configured to receive light 122 from the outside of the PIC 240. The at least one photodetector 212 may be located next to the at least one light optical output interface Tx, e.g. integrated in the common PIC substrate 202. The at least one light optical output interface Tx and the at least one photodetector 212 may be arranged on the same side of the PIC substrate 202.

The at least one photodetector 212 may include a photodiode and a beam combining structure (also denoted as optical combiner, optical beam combiner or optical mixer). The beam combining structure is configured to merge at least two individual beams, e.g. a local oscillator (LO) and light from the optical input interface Rx of the PIC 240, to a single beam. The output of the beam combining structure may effectively be optically split, e.g. into two individual beams, in case a balanced photodiode pair is used (not illustrated).

One or more optical channels 140-*i* of the LIDAR system 200 may include further optical components 250, e.g. a scan mirror (also denoted as scanning mirror) in the light path between a grating structure and the outside of the LIDAR system 200. The grating structure may be a transmission grating, a reflective grating, or a grism. The grating structure may be optically arranged to guide light from the optical output interface Tx of the PIC 240 to the outside of the LIDAR system 200 and from the outside of the LIDAR system 200 to the photodetector 212. The optical components 250 may also include a lens or a lens array (further denoted as lens) that may be arranged between the PIC 240 and the grating structure. The lens may be any one of a converging lens, a collimating lens or a diverging lens.

Using a multiple (M) wavelength laser source (also denoted as light sources) 220 and the grating structure, the number of optical channels may be increased by a factor of M for a given PIC 240 to achieve a desired high number (>100) of vertical resolution elements or pixels.

The one or more optical output interfaces Tx may emit electromagnetic radiation, e.g. ultra-violet light, visible light, infrared radiation, terahertz radiation or microwave radiation (denoted as "light" throughout this specification) to different parts of the scene of the LIDAR system 200, e.g. at the same time or subsequently, e.g. by the grating structure and/or the lens along one or more optical channels 140-*i*. The electromagnetic radiation may include a continuous wave and/or pulsed, e.g. a frequency modulated continuous wave (FMCW) in which the frequency of the received light is swept or chirped. This way, light 114 emitted by the optical output interface Tx of the PIC 240 samples different portions of a target 110 (not the same pixel) and/or different targets 110 at the same time. Thus, light reflected 122 from the target 110 and detected by a photodetector 212 of different optical channels 140-*i* contains information correlated to different portions of a target 110 (not the same pixel) and/or different targets at the same time. In other words, a plurality of optical channels 140-N emit light into different directions in space using the grating. The target back reflects light 122 to the optical input interface Rx. This way, a mapping between the emitted light 114 and the information of the target may be enabled from the returned light 122.

The LIDAR system 200 may include a plurality of light sources (also denoted as (coherent) electromagnetic radiation source) each configured to emit light 220 having a wavelength/frequency different to the wavelength/frequency of the other light sources. The PIC substrate 202 may have integrated therein at least one light receiving input 204 and at least one optical splitter 206 to branch light received at the at least one light receiving input 204 to one of one or more optical channels 140-*i*. The light source provides the light 220 to the optical input structure 204 of the PIC 240.

Alternatively or in addition, the LIDAR system 200 may include one or more light source(s) configured to emit electromagnetic radiation 220 of different/multiple wavelengths/frequencies. An optical filter, e.g. a low pass, high pass, band pass or notch filter may select a wavelength/frequency of a plurality of wavelengths/frequencies of a single light source. This way, by using wavelength multiplexing of spatially parallel optical channels in a PIC 240/waveguide structures 224 of PIC 240, the detrimental effects due to fluctuating targets and TOF limitations are mitigated, thus enabling a coherent LIDAR with high optical resolution, high data rate, and long-range detection to be achieved.

A waveguide structure 224 of the PIC 240 may be in the form of a strip line or micro strip line. However, a waveguide structure 224 may also be configured as a planar waveguide. The waveguide structure 224 may be configured to guide electromagnetic radiation emitted from a light source coupled to the input 204 to the optical output interface Tx. The waveguide structure 224 may be formed from the material of the PIC substrate 202. As an example, at least one waveguide structure 224 may be formed from the PIC substrate 202. Waveguide structures 224 may be optically isolated from each other.

Further, the PIC 240 may include an optical amplifier (SOA) 208 to amplify the light 114, 122 in the waveguide structure 224. In each light path 140-*i*, the photonic integrated circuit 200 may include at least one amplifier structure 208 to amplify the light in the light path to provide an amplified light.

Further illustrated in FIG. 2 is a use of a part of the light from a beam splitter 210 as input signal LO for the photodetector 212 in the optical channel 140-*i*. Here, the local oscillator determines a difference between the light 114 emitted from the optical output interface Tx of the PIC 240 and light 122 received from the optical input interface Rx at the photodetector 212. The difference may consider temporal fluctuations of the emitted light 114 in the received light 122 for each light path 140-*i* individually, thus allowing the LIDAR system 200 to detect and discriminate the optical frequency of the received light.

Figure 4:
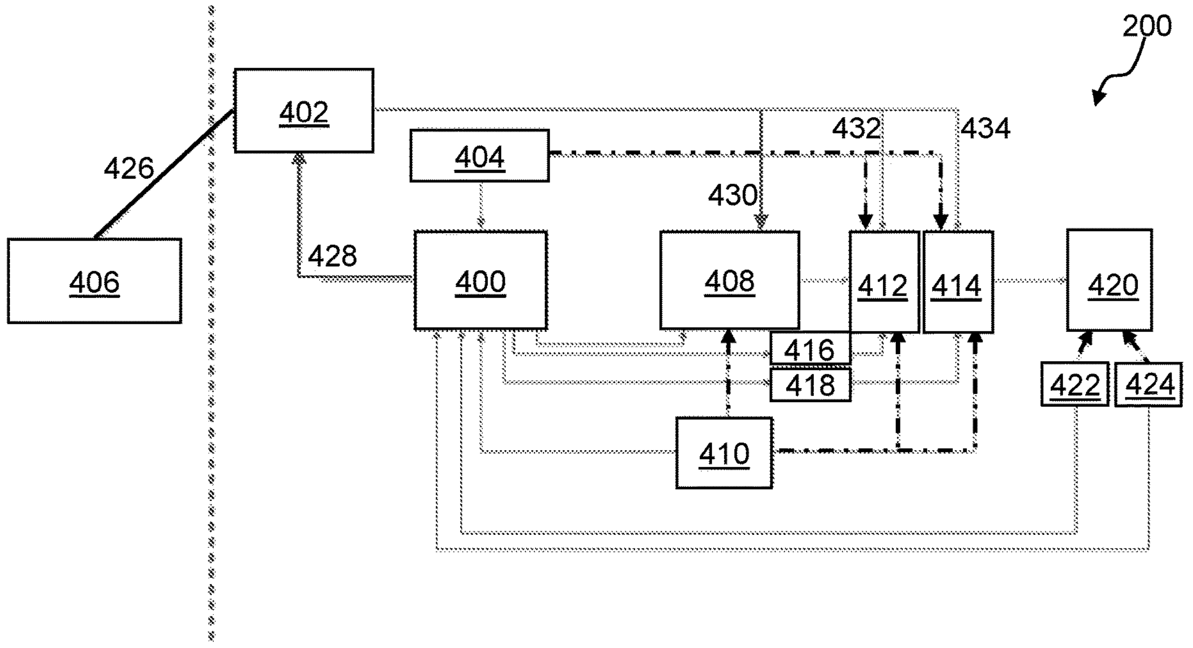
FIG. 4 illustrates an eye safety mechanism of a LIDAR system.
Figure 5:
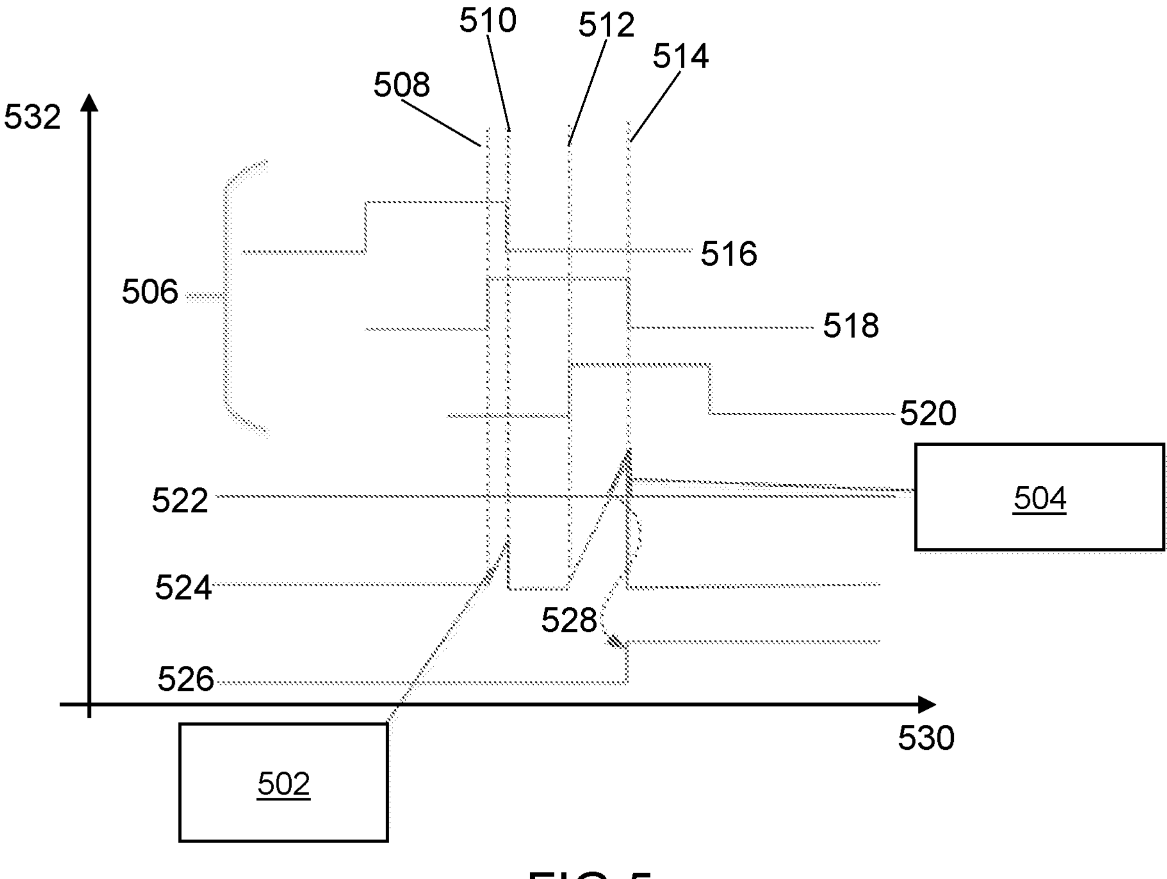
FIG. 5 illustrates a timing diagram of a LIDAR system.

The eye safety mechanism described in more detail in FIG. 4 and FIG. 5 enables that the LIDAR system 200 as schematically illustrated in FIG. 2 is a class I laser product.

Figure 3:
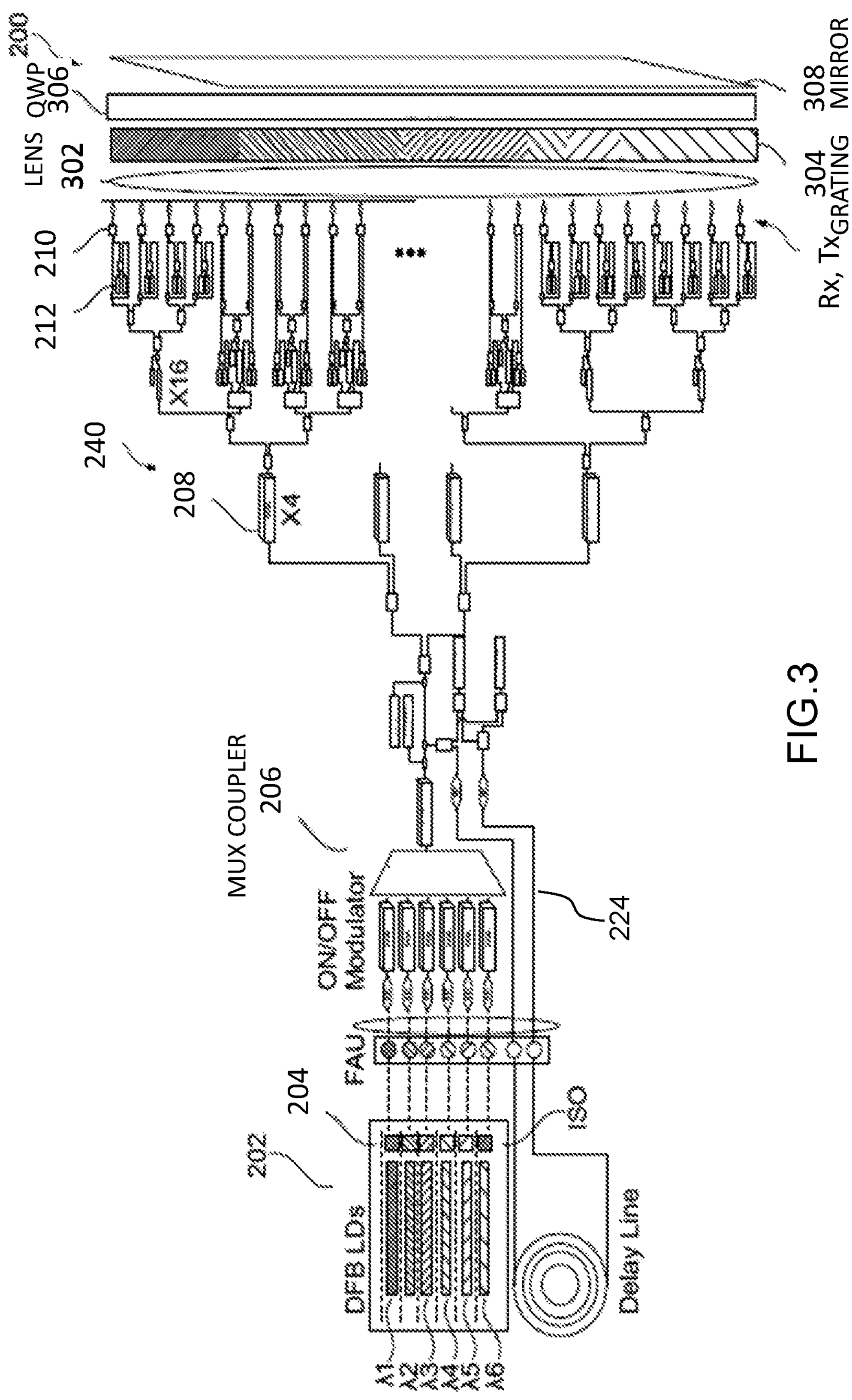
FIG. 3 illustrates a schematic diagram of a LIDAR system.

FIG. 3 illustrates a schematic diagram of a bistatic LIDAR system 200 as an example of a LIDAR system of FIG. 2 in which the eye safety mechanism may be integrated. The LIDAR system 200 includes the PIC 240 as described before. The LIDAR system 200 may further include a scanning mirror 308 in the light path between the grating structure 304 and the outside of the LIDAR system 200. The LIDAR system 200 may further include a quarter wave plate (QWP) 306 in the light path between the grating structure 304 and the scanning mirror 308 and/or the outside of the LIDAR system 200. A lens 302 may be arranged between the PIC 240 and the grating structure 304.

As further illustrated in FIG. 3, the LIDAR system 200 may include a plurality of light sources 220 each configured to emit electromagnetic radiation having a wavelength $\lambda_1$, $\lambda_2$, $\lambda_3$, $\lambda_4$, $\lambda_5$/frequency different to the wavelength/frequency of the other light sources 220. The electromagnetic radiation sources 220 are configured to be operated as a continuous wave laser and/or a pulsed laser.

One or more outputs Tx of the light paths may emit electromagnetic radiation to different parts of a target, e.g. at the same time or subsequently, e.g. by the grating structure 304 and/or the lens structure 302 along one or more light paths. The power of the light output from the LIDAR system may have to fulfill legally obligated safety provisions, e.g. eye safety. As example, the output light power may not exceed a predefined energy density.

Further illustrated in FIG. 3 is the branching of light paths from the at least one input 204 to the plurality of outputs Tx. The branching may be realized by a plurality of optical amplifiers 208, e.g. SOA, a plurality of optical splitters 210 and a plurality of waveguide structures 224 (solid lines in FIG. 3).

The light receiving input 204 may include an optical coupler configured to optically interconnect electromagnetic radiation of an electromagnetic radiation source outside of the PIC substrate 202 (e.g. an external electromagnetic radiation source) to the at least one optical splitter 210.

Further illustrated in FIG. 3 is a use of balanced photodetector pairs as photodetector 212 in the optical channels respectively.

The scanning mirror 308 may be configured to be movable to scan the environment of the LIDAR system 200. Alternatively, or in addition, the grating structure 304 may be configured to be a movable reflection grating. A movable grating structure 304 may function as the scanning mirror 308, as an example. Thus, the LIDAR system 200 may include a movable component for directing the output light to different directions (also denoted as scanning component). The scanning component may be the scanning mirror 308 and/or the scanning grating structure 304, as example.

The LIDAR system 200 may further include a controller (also denoted as processing means 402, see FIG. 4). The controller may be configured to control the at least one electromagnetic radiation source 220 and the amplification of the optical amplifier 208, e.g. regarding an eye safety criteria. FIG. 4 illustrates functional elements of the eye safety mechanism that use the above described components.

The processing means 402 may be configured to communicatively interact a host 406. The processing means 402 may be communicatively coupled to the host 406, e.g. through an ethernet protocol 426. The host 406 may not be part of the LIDAR system 200 (illustrated by a dashed line in FIG. 4). In other words, the host 406 may be external to the LIDAR system 200. The host 406 may be a navigation system, and/or a sensor and control system, e.g., of the vehicle (see FIG. 1). Alternatively, in a testing procedure, the host 406 may be replaced by a tester for calibration purpose. The host 406 may monitor events (also denoted as operational states) determined by the LIDAR system 200, e.g. determined by the processing means 402 as described below in more detail.

The host 406 may include one or more predefined characterization protocols (also denoted as scripts). Thus, if the host 406 determines a predefined event, the host 406 may trigger a response corresponding to the event. As an example, the host 406 may output a predefined notification, e.g. a warning light or message, in case an eye safety event has been determined.

The processing means 402 may be central processing unit (CPU) 402 of the LIDAR system 200. The main processing means 402 may be configured as main sensor control, e.g. a micro-controller.

The eye safety mechanism may include a controlling means 400. The controlling means 400 may be a computer program, e.g. a software, (also denoted as software-based), or firmware (FW). Alternatively, or in addition, the controlling means 400 may be configured as a circuit (also denoted as hardware-based). The controlling means 400 is an interface for the main processing means 402, and reports predefined events (also denoted as predetermined operational states) 428 to the main processing means 402. Illustratively, the controlling means 400 may be a combination of eye safety monitoring mechanism and control mechanism.

As an example, the controlling means 400 may monitor (a sensing process is indicated by a dash-dot line in FIG. 4) the output of one or more electrical current sensor(s) 404, one or more optical sensor(s) 410, a first position sensor 422, a second position sensor 424 and/or one or more temperature sensor(s) (not illustrated). The first position sensor 422 and the second position sensor may be configured for determining a position, e.g. an angular position and/or angular velocity, of a scanning component 420. The scanning component 420 may include one or more of a movable mirror, a movable grating, a movable lens or lens array, and a micro electromechanical system (MEMS) (see also FIG. 2 and FIG. 3)

Alternatively, or in addition, the controlling means 400 may control enablement of one or more light sources via a respective driver 408 (see also FIG. 2 and FIG. 3), and/or one or more optical amplification stage(s) (also denoted as optical driver(s)) 412, 414, e.g. coupled to one or more optical amplifiers described above (see FIG. 2 and FIG. 3). Here, the light source and the optical amplifiers may also be denoted as operational components or functional means.

In case of an eye safety event, the main processing means 402 provides one or more command(s) 430, 432, 434 to one or more components 408, 412, 414 to shut down the LIDAR system 200 or reduce the optical output power of the LIDAR system 200 below a predefined threshold value.

In other words, the eye safety mechanism may respond by reducing the optical output power of the LIDAR system if the current operational state of the LIDAR system 200 corresponds to a predefined operational state associated with an eye safety criterion, e.g. a predefined energy density of the output light (also denoted as power of output light or output light power). As an example, the one or more command(s) 430, 432, 434 may cause a shut down, e.g. a switching off or passing into a standby mode, of the optical output power, e.g. of the optical amplification stages 412, 414 (e.g. an optical amplifier of one or more light paths) and/or light source(s) via the light source driver 402.

Alternatively, or in addition, the eye safety mechanism may also carry out a self-test to test a potentially output optical power before allowing optical output power. The self-test may include a monitoring of electrical signals and/or optical signal determined by one or more current sensor(s) 404 and/or one or more optical sensor(s) 410. The one or more sensor(s) 404, 410 transmit the monitored signals (solid lines in FIG. 4 illustrate information, signals or data) to the controlling means 400.

The current sensor (also denoted as electrical sensor) 404 may be configured to sense an electrical current applied to at least one of an electrical amplifier and/or an optical amplifier. The sensed current may correspond to a current used for light amplification corresponding to the optical output power.

The optical sensor (also denoted as photodetector or monitoring photo diode) 410 monitors an optical power, e.g. of light from the light source in a waveguide structure that corresponds to the output optical power of the LIDAR system.

The one or more optical driver(s) (also denoted as optical stages) 412, 414 may turn an input electrical current to light amplification via the optical amplifiers (see FIG. 2 and FIG. 3). The optical drivers 412, 414 may be capable upon command 432, 434 (also denoted as signaling) to increase the electrical current input to the optical amplifiers. Hence, the commands 432, 434 may adjust the output light power below or above a predefined threshold value corresponding to an eye safety.

Further, the optical drivers 412, 414 may be used to emulate an eye safety event that can be completely detached from the eye safety mechanism, e.g. in or as part as a built in self-test. The controlling means 400 and the main processing means 402 can detect the emulated eye safety event, e.g. a failure to comply with an eye safety relevant standard. The controlling means 400 and main processing means 402 may than respond to the detected eye safety event by shutting down the optical output, e.g. via one or more command 430, 432, 434 submitted to the light source driver 408 and/or the optical driver(s) 412, 414.

The scanning component 420 scans the output optical light beam over the scene of the LIDAR system 200. The first position sensor 422 and the second position sensor 424 (also denoted as first scan monitor and second scan monitor) may be configured as scan monitoring provisions to monitor the position of the output light beam. As an example, the first position sensor 441 and the second position sensor 442 may provide (solid lines in FIG. 4) a position indication of the scanning component 420 to the controlling means 400, e.g. timing signals (also denoted as timings) corresponding to a time instant the respective position sensor senses the output light beam. Based on the time period between the timing of the first position sensor and the timing of the second position sensor, an angular velocity of the output light beam can be determined that corresponds to an energy density of the output light beam. As an example, the first position sensor 422 and the second position sensor 424, e.g. the scanning monitor, monitor to check whether the scanning component 420 keeps moving in a sufficient velocity and is not spreading the energy on a small area, e.g. a high energy density per second. This way, compliance with an eye safety specification may be provided.

Illustratively, the eye safety mechanism and the self-testing mechanism of the eye safety mechanism may include at least one light source, e.g. a laser emitting element, at least one optical amplifier (see FIG. 2, also denoted as Light-Amp—laser light amplification), and a scanning component, e.g. a scanning mirror or a micro electromechanical system (MEMS). The optical output power of the LIDAR system 200 may correspond to current input to the optical amplifier. The higher the input current to optical amplifiers the higher the optical power output from the LIDAR system. The monitoring components, e.g. the sensors, on the light source output power may include an electrical sensor (e.g. current monitoring) and/or an optical sensor, e.g. a photodiode, for optical output monitoring (e.g. the MPD).

Illustratively, the scanning monitoring may have two independent position monitoring mechanisms (e.g. the first position sensor 422 and the second position sensor 424). This way, by determining the time period between the time instances of signal receiving from the first position sensor 422 and the second position sensor 424, and a predefined (angular) distance between the first position sensor 422 and the second position sensor 424, the velocity of the scanning component 420 may be determined.

The eye safety mechanism may include independent monitoring with different way of operation, e.g. current monitoring via the electrical sensor 404 and MPD reading via the optical sensor 410. Each signal from the electrical sensor 404 and the optical sensor 410 may be sufficient to monitor and trigger an eye safety event in case of failure.

As an example of a build in self-test (BIST) for the eye safety mechanism, the main processing means (also denoted as controller, processor or main central processing unit (CPU)) 402 may raise the operational power, e.g. an input electrical current, of one or more optical driver(s) 412, 414 above a predefined threshold value corresponding to a failure of eye safety using a command 432, 434. Alternatively, or in addition, the controlling means 400 may increase the operational power of one or more optical driver(s) 412, 414 using Watchdog supply 416, 418 to power up optical output power of the LIDAR system 200.

Here, the term Watchdog supply refers to an electronic or software timer that is used to detect and recover from malfunctions of components of the optical amplifiers.

The main processing means 402 may control one or more optical driver(s) 412, 414 shortly after the command 432, 434, e.g. within a predefined time period, triggering the electrical sensor(s) 404 and/or optical sensor(s) 410 for an eye safety event in the short period of time. Here, eye safety may correspond to the time period between the first detection of exceeding a predefined eye safety threshold value from any one of the electrical sensor(s) and the optical sensor(s) and the response time instance of shutting down the power of the one or more light source emitting light in the time period. This BIST method may also be denoted as timing characterization mechanism.

As an example of a build in self-test for the eye safety mechanism, the main processing means 402 and/or the controlling means 400 may slowly increase optical output power of the LIDAR system 200 until the electrical sensor (s) and the optical sensor(s) trigger (also denoted as indicate) an eye safety event. In other words, optical output power increases until the monitored optical signal and/or electrical signal exceed predefined threshold values corresponding to an eye safety event, e.g. corresponding to an output optical power exceeding an eye safe energy density of the output light. The time duration (also denoted as time instance) between the timing of the detection of the eye safety event and the timing of exceeding the predefined threshold value may be determined. The time instance allows to determine, e.g. accurately measure, a difference (also denoted as delta) in optical power and/or electrical power between a linear signal response, e.g. from the current sensor 404, and an unknown response, e.g. from an optical sensor 412, 414.

FIG. 5 illustrates a timing diagram (time 530 versus power 532) of three light sources 516, 518, 520 of a LIDAR system as described above. Shown are the output power of the light sources 516, 518, 520 detected by the optical sensor 506 (410—see FIG. 4). Further illustrated is the optical output power 524, and a predefined threshold value 522 corresponding to exceeding of eye safe optical output power of the light sources 516, 518, 520 of the LIDAR system. Further, a non-violating overlap event 502 and an eye safety-violating overlap event 504 of the optical output power of the light sources 516, 518, 520 of the LIDAR system are illustrated. The eye safety-violating overlap event 504 corresponds to an output optical power that exceeds the predefined threshold value 522 corresponding to an eye safe operational state of the LIDAR system. The eye safety-violating overlap event 504 triggers in the controlling means (400—see FIG. 4) an eye safety event 528 that is reported to the processing means (402—see FIG. 4). Here, the eye safety event 528 may be indicated as a change of the operational state 526 of the LIDAR system, e.g. a change of a value of a flag bit in the controlling means. The processing means commands (430—see FIG. 4) a turning off of the light sources 516, 518, 520 and/or commands (432, 434—see FIG. 4) a reduction of power, e.g. a shut down, of optical amplifiers (208—see FIG. 2 and FIG. 3) of the LIDAR system (not illustrated).

Thus, in case of multiple light sources 516, 518, 520 that are switched on (also denoted as active) at the same time, the eye safety mechanism can monitor that the LIDAR system outputs only an allowed optical output power, e.g. that only an allowed number of light sources 516, 518, 520 are active at the same time.

The electrical input of the optical driver 412, 414 may be monitored and/or controlled by a WatchDog time. In case the controlling means 400 fails to reset the WatchDog the supply of the optical driver(s) 412, 414 may drop and optical output power of the LIDAR system may cease. This may be done on multiple levels (also denoted as stages, e.g. at least two as illustrated by the first optical driver 412 and the second optical driver 414 as illustrated in FIG. 4).

Figure 6:
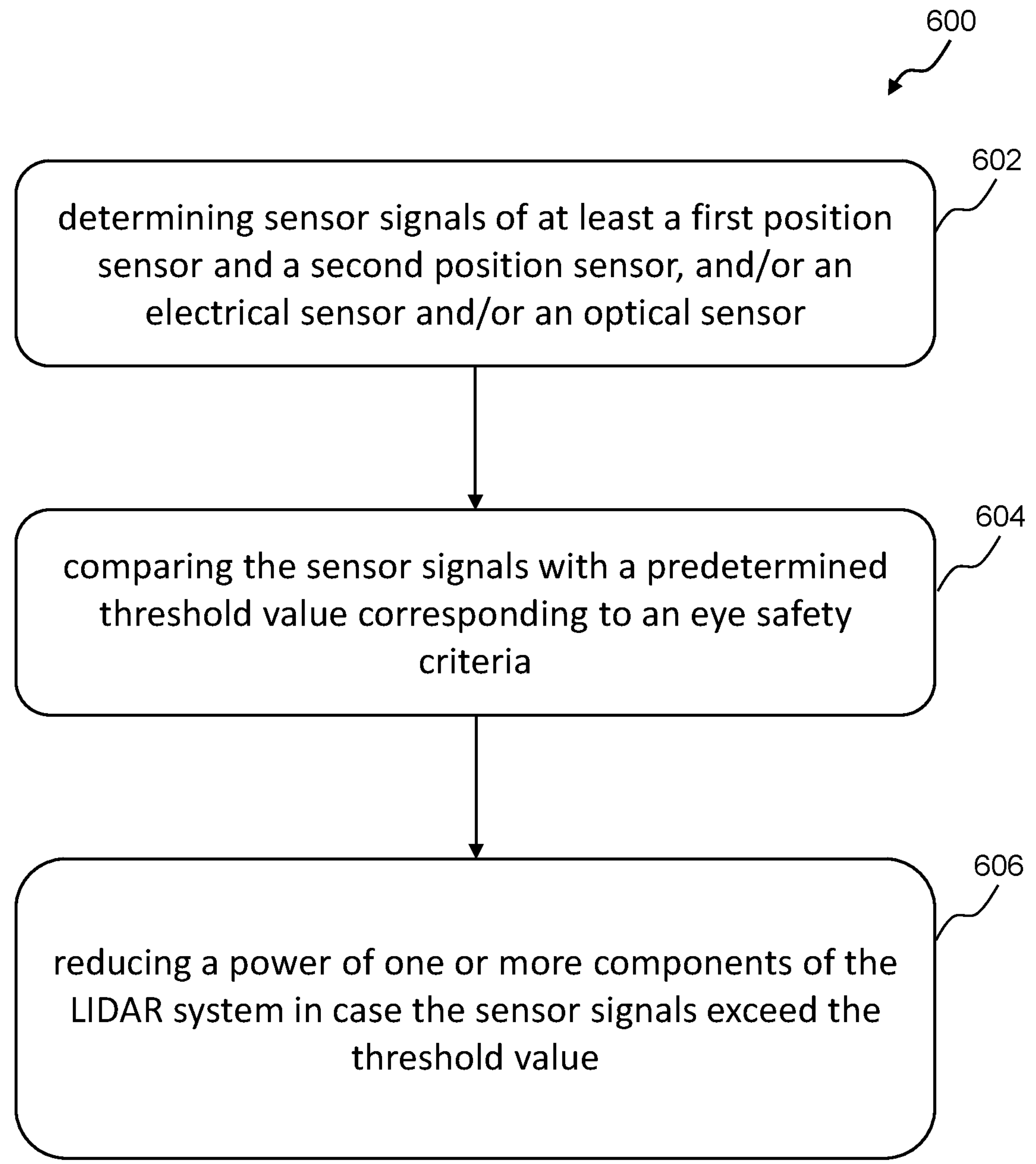
FIG. 6 illustrates a flow diagram of a method to operate a LIDAR system.

FIG. 6 illustrates a flow diagram of a method to operate a LIDAR system. The LIDAR system may be configured according to an above-described example. The method 600 may include determining 602 sensor signals of at least a first position sensor detecting a first position of a LIDAR scanning component and a second position sensor detecting a second position of the LIDAR scanning component, and/or an electrical sensor configured to detect an electrical current applied to an optical amplifier of the LIDAR system that controls the amplification of the optical amplifier and/or an optical sensor configured to detect light including at least one of the light from a light source of the LIDAR system or generated output light of the LIDAR system.

The method 600 may further include comparing 604 the determined signals of the sensors (e.g. the of first and second sensors, the electrical and/or the optical sensors) with a predefined threshold value corresponding to an eye safety criteria. The eye safety criteria may correspond to an energy density of light emitted to the scene of the LIDAR system. As an example, the eye-safety criterion may be a time period (also denoted as time instance) between a timing of the first position sensor 422 detecting the scanning component 420 in the first position and a timing of the second position sensor 424 detecting the scanning component 420 in the second position. A time period exceeding a threshold time period corresponds to a scanning velocity of the scanning component causing an energy density that exceeds an eye safe use of the LIDAR system. Thus, an eye safety event may be triggered.

The method 600 further includes reducing 606 a power, e.g. switching off, of one or more components of the LIDAR system in case the determined signals of the sensors exceed the predefined threshold value. The one or more components may be an optical amplifier configured to amplify light provided by a light source and/or the LIDAR system.

The method 600 may further include a build in self-test of the eye-safety mechanism that includes performing a test procedure independent from the operational state of the LIDAR system. As an example, the processing means described above may upon command from the host increase the input electrical current to the optical amplifier and/or increase the input light to the optical sensor independently from a regular operation of the LIDAR system. This way, without generating an eye-safety event in the outside of the LIDAR system, an eye safety event may be internally determined by the processing means of the LIDAR system.

In other words, with regard to FIG. 1 to FIG. 6, a vehicle 100 may include a light detection and ranging (LIDAR) system 200 as described in the following. The LIDAR system 200 may be an obstacle detection system of the vehicle. The LIDAR system 200 may include a LIDAR scanning component 420; a processor (also denoted as processing means) 402 configured to control the LIDAR scanning component 420; a first position sensor 422 configured to detect a first position of the LIDAR scanning component 420; a second position sensor 424 configured to detect a second position of the LIDAR scanning component 420. The processor 402 may be configured to determine whether an eye-safety criterion is met based on the timing the LIDAR scanning component 420 has been detected in the first position and in the second position, and the processor 402 may be configured to control light output of the LIDAR system 200 based on whether the eye-safety criterion is met.

The eye-safety criterion may be a time period (also denoted as time instant) between the timing of the first position sensor 422 detecting the position of the LIDAR scanning component 420 and the timing of the second position sensor 424 detecting the position of the LIDAR scanning component 420. The scanning component 420 may be a movable mirror 308, a movable grating 304, a movable lens 302, or any combination thereof. The processor 402 may reduce the power or switch off one or more components in case the current operational state exceeds the eye-safety criterion.

Alternatively, or in addition, the LIDAR system 200 includes an optical amplifier 208 to amplify light provided by a light source 220 to generate output light with an output light power. The processor 402 may be configured to control the optical amplifier 208. The LIDAR system may include an electrical sensor 404 configured to detect a current applied to the optical amplifier 208 to control the amplification of the optical amplifier 208. The current detected by the current sensor corresponds to the output light power. The LIDAR system may further include at least one optical sensor 410 412, 414 configured to detect light including at least one of the light from the light source 220 or the generated output light. The processor 402 may be configured to control output of the output light of the LIDAR system 200 based on the detected current and the detected light.

The processor 402 may be configured to control the light output of the LIDAR system 200 by turning off the light source 220. Alternatively, or in addition, the processor 402 may be configured to control the light output of the LIDAR system 200 by turning off the optical amplifier 208. The processor 402 may be further configured to increase the amplification of the optical amplifier 208 over a predefined threshold value 522 corresponding to an eye-safety criterion, trigger, within a predefined time period, the electrical sensor 404 to detect an electrical current, e.g. input to the optical amplifier 208 and/or one or more light sources 220, and the optical sensor 410 to detect a light, e.g. an output light amplified by the optical amplifier 208, and determine a time period between a detection timing of one of the signals detected by the electrical sensor 404 or the optical sensor 410, and a turning off timing of the light source 220 and/or the optical amplifier 208.

The processor 402 may be further configured to trigger, within a predefined time period, the electrical sensor 404 to detect an electrical current, e.g. input to the optical amplifier 208 and/or one or more light sources 220, and the optical sensor 410 to detect a light, e.g. an output light amplified by the optical amplifier 208, continuously increase the amplification of the optical amplifier 208, and determine the electrical current and the light when the electrical sensor 404 detects an electrical current and the optical sensor 410 detects the light over a predefined threshold value 522 corresponding to an eye-safety criterion. The processor 402 may further be configured to determine a power difference based on a power corresponding to the detected electrical current and a power corresponding to the detected light. In other words, the processor may determine a difference between the signals received from the optical sensor 410 and the electrical sensor 404 since one of them may respond in a non-linear manner to a change of an electrical current input to the optical amplifier. In other words, the optical amplifier 208 may output a light having an optical power that corresponds in a non-linear manner to an electrical current input to the optical amplifier 208. The non-linear relation may be determined from the difference of the signals form the electric current sensor 404 and the optical sensor 410.

The LIDAR system 200 may further include a plurality of light sources 220. The processor 402 may be configured to determine a number of light sources 220 of the plurality of light sources 220 emitting light within a predefined time period. At least one light source 220 may include at least one laser.

The LIDAR system may include a plurality of optical components 200, 302, 304, 306 (also denoted as optics of the LIDAR system). The plurality of optical components 200, 302, 304, 306 includes a photonic integrated system 200 having a photonic semiconductor substrate having integrated therein a plurality of light paths 140-*i*, wherein each of the plurality of light paths 140-*i* includes an input 204 coupled to a light source 220 of coherent electromagnetic radiation, an optical amplifier 208, and an output Tx configured to emit the electromagnetic radiation to the outside of the LIDAR system 200 (also denoted as scene of the LIDAR system).

As an example, a computer readable medium may have instructions stored therein that, when executed by one or more processors 402, cause the processor 402 to control the LIDAR scanning component 420; determine whether an eye-safety criterion is fulfilled based on the first position of the LIDAR scanning component 420 detected by the first position sensor 422 and the second position of the LIDAR scanning component 420 detected by a second position sensor 424, and control light output of the LIDAR system 200 based on whether the eye-safety criterion is met. The eye-safety criterion may be a time period (also denoted as time instance) between a timing of the first position sensor 422 detecting the scanning component 420 in the first position and a timing of the second position sensor 424 detecting the scanning component 420 in the second position.

As another example, a computer readable medium may have instructions stored therein that, when executed by one or more processors 402, cause the processor 402 to: control an optical amplifier 208 configured to amplify light provided by a light source 220 to generate output light with an output light power; control output of the output light of the LIDAR system 200 based on a detected electrical current and a detected light, the electrical sensor 404 configured to detect the electrical current applied to the optical amplifier 208 to control the amplification of the optical amplifier 208, the detected electrical current for the output light power. The optical sensor 410 configured to detect light including at least one of the lights from the light source 220 or the generated output light.

The control of the light output out of the LIDAR system 200 may include turning off the light source 220. Alternatively, or in addition, the control of the light output out of the LIDAR system 200 may include turning off the optical amplifier 208. Alternatively, or in addition, the computer readable medium may include instructions that, when executed by one or more processors 402, cause the processor 402 to increase the amplification of the optical amplifier 208 over a predefined threshold value 522 corresponding to an eye-safety criterion, trigger, within a predefined time period, the electrical sensor 404 to detect a current and the optical sensor 410 to detect a light, and determine a time period between a detection time of one of the electrical sensor 404 and the optical sensor 410, and a turning off time instant of the light source 220. Alternatively, or in addition, the computer readable medium may include instructions that, when executed by one or more processors 402, cause the processor 402 to: trigger, within a predefined time period, the electrical sensor 404 to detect a current and the optical sensor 410 to detect a light, continuously increase the amplification of the optical amplifier 208, and determine the electrical current and the light when the electrical sensor 404 detects an electrical current and the optical sensor 410 detects the light over a predefined threshold value 522 corresponding to an eye-safety criterion, and determine a power difference based on a power corresponding to the detected electrical current and a power corresponding to the detected light.

In the following, various examples are provided that may include one or more aspects described above.

Example 1 is a light detection and ranging (LIDAR) system, including: a LIDAR scanning mirror; a processor configured to control the LIDAR scanning mirror; a first position sensor configured to detect a position of the LIDAR scanning mirror; a second position sensor configured to detect the position of the LIDAR scanning mirror; the processor configured to determine whether an eye-safety criterion is met based on the position of the LIDAR scanning mirror detected by the first position sensor and the second position sensor, and to control light output of the LIDAR system based on whether the eye-safety criterion is met.

In Example 2, the subject matter of Example 1 can optionally include that the eye-safety criterion is a time period between a time instant of the first position sensor detecting the position of the LIDAR scanning mirror and a time instant of the second position sensor detecting the position of the LIDAR scanning mirror.

Example 3 is a light detection and ranging (LIDAR) system, including an optical amplifier to amplify light provided by a light source to generate output light with an output light power; a processor configured to control the optical amplifier; an electrical sensor configured to detect a current applied to the optical amplifier to control the amplification, the detected current for the output light power; and an optical sensor configured to detect light including at least one of the light from the light source or the generated output light; the processor configured to control output of the output light of the light detection and ranging system based on the detected current and the detected light whether an eye-safety criterion is met.

In Example 4, the subject matter of any one of Examples 1 to 3 can optionally include that the processor is configured to control the light output of the LIDAR system by turning off the light source.

In Example 5, the subject matter of any one of Examples 1 to 4 can optionally include that the processor is configured to control the light output of the LIDAR system by turning off the optical amplifier.

In Example 6, the subject matter of any one of Examples 3 to 5 can optionally include that the processor is further configured to perform a test procedure, the test procedure including: exceed (also denoted as increase) the amplification of the optical amplifier over a predefined threshold value corresponding to an eye-safety criterion; trigger, within a predefined time period, the electrical sensor to detect a current and the optical sensor to detect a light, and determine a time period between a detection time of one of the electrical sensor or the optical sensor, and a turning off time instant of the light source.

In Example 7, the subject matter of Example 6 can optionally include that the processor is configured to perform the test procedure at a predetermined timing, wherein the predetermined timing is one of: before initial operation, after a predetermined time period of inactivity, during powering up of the LIDAR system, and after preset time periods In Example 8, the subject matter of any one of Examples 3 to 7 can optionally include that the processor is further configured to perform a test procedure, the test procedure including: trigger, within a predefined time period, the electrical sensor to detect a current and the optical sensor to detect a light, continuously increase the amplification of the optical amplifier, and determine the electrical current and the light when the electrical sensor detects an electrical current and the optical sensor detects the light over a predefined threshold value corresponding to an eye-safety criterion, and determine a power difference based on a power corresponding to the detected electrical current and a power corresponding to the detected light.

In Example 9, the subject matter of any one of Example 8 can optionally include that the processor is configured to perform the test procedure at a predetermined timing, wherein the predetermined timing is one of: before initial operation, after a predetermined time period of inactivity, during powering up of the LIDAR system, and after preset time periods.

In Example 10, the subject matter of any one of Examples 3 to 9 can optionally include that the processor is further configured to perform a test procedure, the test procedure including: trigger, within a predefined time period, the electrical sensor to detect a current and the optical sensor to detect a light, continuously decrease a predefined threshold value corresponding to an eye-safety criterion, and determine the electrical current and the light when the electrical sensor detects an electrical current and the optical sensor detects the light over the predefined threshold value, and determine a power difference based on a power corresponding to the detected electrical current and a power corresponding to the detected light, or determine a time period between a detection time of one of the electrical sensor or the optical sensor, and a turning off time instant of the light source.

In Example 11, the subject matter of any one of Example 10 can optionally include that the processor is configured to perform the test procedure at a predetermined timing, wherein the predetermined timing is one of: before initial operation, after a predetermined time period of inactivity, during powering up of the LIDAR system, and after preset time periods.

In Example 12, the subject matter of any one of Examples 1 to 11 can optionally include a plurality of light sources, wherein the processor is further configured to determine a number of light sources of the plurality of light sources emitting light within a predefined time period.

In Example 13, the subject matter of any one of Examples 1 to 12 can optionally include optics of the light detection and ranging system.

In Example 14, the subject matter of any one of Examples 1 to 13 can optionally include that the plurality of optical components includes a photonic integrated system having a photonic semiconductor substrate having integrated therein a plurality of light paths, wherein each of the plurality of light paths includes input coupled to a light source of coherent electromagnetic radiation, an optical amplifier, and an output configured to emit the electromagnetic radiation to the outside of the light detection and ranging system.

In Example 15, the subject matter of any one of Examples 1 to 14 can optionally include that the at least one light source includes at least one laser.

Example 16 is a computer readable medium having instructions stored therein that, when executed by one or more processors, cause the processor to control the LIDAR scanning mirror; determine whether an eye-safety criterion is fulfilled based on the position of the LIDAR scanning mirror detected by a first position sensor and a second position sensor, and control light output of the LIDAR system based on whether the eye-safety criterion is met, the first position sensor configured to detect a position of the LIDAR scanning mirror; the second position sensor configured to detect the position of the LIDAR scanning mirror.

In Example 17, the subject matter of Example 16 can optionally include that the eye-safety criterion is a time period between a time instant of the first position sensor detecting the position of the LIDAR scanning mirror and a time instant of the second position sensor detecting the position of the LIDAR scanning mirror.

Example 18 is a computer readable medium having instructions stored therein that, when executed by one or more processors, cause the processor to: control an optical amplifier configured to amplify light provided by a light source to generate output light with an output light power; control output of the output light of the light detection and ranging system based on a detected current and a detected light, the electrical sensor configured to detect a current applied to the optical amplifier to control the amplification, the detected current for the output light power; and the optical sensor configured to detect light including at least one of the light from the light source or the generated output light.

In Example 19, the subject matter of any one of Example 18 can optionally include that the control of the light output out of the LIDAR system includes turning off the light source.

In Example 20, the subject matter of any one of Examples 18 to 19 can optionally include that the control of the light output out of the LIDAR system includes turning off the optical amplifier.

In Example 21, the subject matter of any one of Examples 18 to 20 can optionally include instructions stored therein that, when executed by one or more processors, cause the processor to: exceed the amplification of the optical amplifier over a predefined threshold value corresponding to an eye-safety criterion, trigger, within a predefined time period, the electrical sensor to detect a current and the optical sensor to detect a light, and determine a time period between a detection time of one of the electrical sensor and the optical sensor, and a turning off time instant of the light source.

In Example 22, the subject matter of any one of Examples 18 to 21 can optionally include instructions stored therein that, when executed by one or more processors, cause the processor instructions to perform a test procedure, the test procedure including: trigger, within a predefined time period, the electrical sensor to detect a current and the optical sensor to detect a light, continuously increase the amplification of the optical amplifier, and determine the electrical current and the light when the electrical sensor detects an electrical current and the optical sensor detects the light over a predefined threshold value corresponding to an eye-safety criterion, and determine a power difference based on a power corresponding to the detected electrical current and a power corresponding to the detected light.

In Example 23, the subject matter of Example 22 can optionally include that the test procedure is performed at a predetermined timing, wherein the predetermined timing is one of: before initial operation, after a predetermined time period of inactivity, during powering up of the LIDAR system, and after preset time periods.

In Example 24, the subject matter of any one of Examples 18 to 23 can optionally include instructions stored therein that, when executed by one or more processors, cause the processor instructions to perform a test procedure, the test procedure including: trigger, within a predefined time period, the electrical sensor to detect a current and the optical sensor to detect a light, continuously increase the amplification of the optical amplifier, and determine the electrical current and the light when the electrical sensor detects an electrical current and the optical sensor detects the light exceeding predefined threshold values corresponding to an eye-safety criterion, and determine a power difference based on a power corresponding to the detected electrical current and a power corresponding to the detected light.

In Example 25, the subject matter of Example 24 can optionally include that the test procedure is performed at a predetermined timing, wherein the predetermined timing is one of: before initial operation, after a predetermined time period of inactivity, during powering up of the LIDAR system, and after preset time periods.

Example 26 is a vehicle including a light detection and ranging system according to any one of Examples 1 to 25.

Example 27 is a sensor system including a light detection and ranging system according to any one of Examples 1 to 26.

Example 28 is a light detection and ranging (LIDAR) system, including a LIDAR scanning mirror; a processor configured to control the LIDAR scanning mirror; a first position sensor configured to determine a first position and a second position sensor configured to detect a second position of the LIDAR scanning mirror. The processor may be configured to determine whether an eye-safety criterion is met based on the first position and the second position, and control light output of the LIDAR system based on whether the eye-safety criterion is met.

In Example 29, the subject matter of Example 28 can optionally include that the eye-safety criterion is a time period between a timing of the first position sensor detecting the LIDAR scanning mirror in the first position and a timing the second position sensor detecting the LIDAR scanning mirror in the second position.

Example 30 is a light detection and ranging (LIDAR) system including an optical amplifier to amplify light provided by a light source to generate output light of the LIDAR system having an output light power; a processor configured to control the optical amplifier; an electrical sensor configured to detect a current applied to the optical amplifier to control the amplification of the optical amplifier, wherein the detected current corresponds to the output light power; and an optical sensor configured to detect light including at least one of the light from the light source and the generated output light. The processor may be configured to control the output light power of the output light based on the detected current and the detected light whether an eye-safety criterion is met.

In Example 31, the subject matter of Example 30 can optionally include that the processor is configured to control the light output of the LIDAR system by turning off the light source.

In Example 32, the subject matter of any one of Examples 30 to 31 can optionally include that the processor is configured to control the light output of the LIDAR system by turning off the optical amplifier.

In Example 33, the subject matter of any one of Examples 30 to 32 can optionally include that the processor is further configured to: increase the amplification of the optical amplifier over a predefined threshold value corresponding to an eye-safety criterion, trigger, within a predefined time period, the electrical sensor to detect a current and the optical sensor to detect a light, and determine a time period between a detection time of one of the electrical sensor or the optical sensor, and a turning off time instant of the light source.

In Example 34, the subject matter of any one of Examples 30 to 33 can optionally include that the processor is further configured to: trigger, within a predefined time period, the electrical sensor to detect a current and the optical sensor to detect a light, continuously increase the amplification of the optical amplifier, and determine the electrical current and the light when the electrical sensor detects an electrical current and the optical sensor detects the light over a predefined threshold value corresponding to an eye-safety criterion, and determine a power difference based on a power corresponding to the detected electrical current and a power corresponding to the detected light.

In Example 35, the subject matter of any one of Examples 30 to 34 can optionally include a plurality of light sources, wherein the processor is further configured to determine a number of light sources of the plurality of light sources emitting light within a predefined time period.

Example 36 is a computer readable medium having instructions stored therein that, when executed by one or more processors, cause the processor to determine sensor signals of: at least a first position sensor detecting a first position of a LIDAR scanning component and a second position sensor detecting a second position of the LIDAR scanning component, and/or an electrical sensor configured to detect an electrical current applied to an optical amplifier of the LIDAR system that controls the amplification of the optical amplifier and/or an optical sensor configured to detect light including at least one of the light from a light source of the LIDAR system or generated output light of the LIDAR system; compare the determined signals of the sensors with a predefined threshold value corresponding to an eye safety criteria; and reduce a power of one or more components of the LIDAR system in case the determined signals of the sensors exceed the predefined threshold value.

In Example 37, the subject matter of Example 36 can optionally include that the one or more components is an optical amplifier configured to amplify light provided by a light source and/or the LIDAR system.

In Example 38, the subject matter of any one of Examples 36 or 37 can optionally include instructions to perform a test procedure independent from the operational state of the LIDAR system, wherein the test procedure includes increasing of an input electrical current to the optical amplifier and/or increasing the input light to the optical sensor.

In Example 39, the subject matter of any one of Examples 36 to 38 can optionally include that reducing power of one or more components of the LIDAR system includes a turning off of the one or more components.

In Example 40, the subject matter of any one of Examples 36 to 39 can optionally include instructions to: increase the amplification of the optical amplifier over a predefined threshold value corresponding to an eye-safety criterion, trigger, within a predefined time period, the electrical sensor to detect a current and the optical sensor to detect a light, and determine a time period between a detection timing of one of the electrical sensor and the optical sensor, and a power reduction timing of the one or more components.

In Example 41, the subject matter of any one of Examples 36 to 40 can optionally include instructions to: trigger, within a predefined time period, the electrical sensor to detect a current and the optical sensor to detect a light, continuously increase the amplification of the optical amplifier, and determine the electrical current and the light when the electrical sensor detects an electrical current and the optical sensor detects the light exceeding predefined threshold values corresponding to an eye-safety criterion, and determine a power difference based on a power corresponding to the detected electrical current and a power corresponding to the detected light.

Example 42 is a light detection and ranging (LIDAR) means including a processing means for determining signals of sensing means of: at least a first position sensing means detecting a first position of a LIDAR scanning means and a second position sensing means for detecting a second position of the LIDAR scanning means, and/or an electrical sensing means for detecting an electrical current applied to an optical amplification means of the LIDAR means that controls the amplification of the optical amplification means and/or an optical sensing means for detecting light including at least one of the light from a light emitting means of the LIDAR means or generated output light of the LIDAR means; compare the determined signals of the sensing means with a predefined threshold value corresponding to an eye safety criteria; and reduce a power of one or more functional means of the LIDAR means in case the determined signals of the sensing means exceed the predefined threshold value.

In Example 43, the subject matter of Example 42 can optionally include that the one or more functional means is an optical amplification means configured to amplify light provided by a light emitting means and/or the LIDAR means.

In Example 44, the subject matter of any one of Examples 42 or 43 can optionally include instructions to perform a test procedure independent from the operational state of the LIDAR means, wherein the test procedure includes increasing of an input electrical current to the optical amplification means and/or increasing the input light to the optical sensing means.

In Example 45, the subject matter of any one of Examples 42 to 44 can optionally include that reducing power of one or more functional means of the LIDAR means includes a turning off of the one or more functional means.

In Example 46, the subject matter of any one of Examples 42 to 45 can optionally include instructions to: increase the amplification of the optical amplification means over a predefined threshold value corresponding to an eye-safety criterion, trigger, within a predefined time period, the electrical sensing means to detect a current and the optical sensing means to detect a light, and determine a time period between a detection timing of one of the electrical sensing means and the optical sensing means, and a power reduction timing of the one or more functional means.

In Example 47, the subject matter of any one of Examples 42 to 46 can optionally include instructions to: trigger, within a predefined time period, the electrical sensing means to detect a current and the optical sensing means to detect a light, continuously increase the amplification of the optical amplification means, and determine the electrical current and the light when the electrical sensing means detects an electrical current and the optical sensing means detects the light exceeding predefined threshold values corresponding to an eye-safety criterion, and determine a power difference based on a power corresponding to the detected electrical current and a power corresponding to the detected light.

The word “exemplary” is used herein to mean “serving as an example, instance, or illustration.” Any example or design described herein as “exemplary” is not necessarily to be construed as preferred or advantageous over other examples or designs.

The words “plurality” and “multiple” in the description or the claims expressly refer to a quantity greater than one. The terms “group (of)”, “set [of]”, “collection (of)”, “series (of)”, “sequence (of)”, “grouping (of)”, etc., and the like in the description or in the claims refer to a quantity equal to or greater than one, i.e. one or more. Any term expressed in plural form that does not expressly state “plurality” or “multiple” likewise refers to a quantity equal to or greater than one.

The terms “processor” or “controller” as, for example, used herein may be understood as any kind of technological entity that allows handling of data. The data may be handled according to one or more specific functions that the processor or controller execute. Further, a processor or controller as used herein may be understood as any kind of circuit, e.g., any kind of analog or digital circuit. A processor or a controller may thus be or include an analog circuit, digital circuit, mixed-signal circuit, logic circuit, processor, microprocessor, Central Processing Unit (CPU), Graphics Processing Unit (GPU), Digital Signal Processor (DSP), Field Programmable Gate Array (FPGA), integrated circuit, Application Specific Integrated Circuit (ASIC), etc., or any combination thereof. Any other kind of implementation of the respective functions may also be understood as a processor, controller, or logic circuit. It is understood that any two (or more) of the processors, controllers, or logic circuits detailed herein may be realized as a single entity with equivalent functionality or the like, and conversely that any single processor, controller, or logic circuit detailed herein may be realized as two (or more) separate entities with equivalent functionality or the like.

The term "connected" can be understood in the sense of a (e.g. mechanical and/or electrical), e.g. direct or indirect, connection and/or interaction. For example, several elements can be connected together mechanically such that they are physically retained (e.g., a plug connected to a socket) and electrically such that they have an electrically conductive path (e.g., signal paths exist along a communicative chain).

While the above descriptions and connected figures may depict electronic device components as separate elements, skilled persons will appreciate the various possibilities to combine or integrate discrete elements into a single element. Such may include combining two or more circuits from a single circuit, mounting two or more circuits onto a common chip or chassis to form an integrated element, executing discrete software components on a common processor core, etc. Conversely, skilled persons will recognize the possibility to separate a single element into two or more discrete elements, such as splitting a single circuit into two or more separate circuits, separating a chip or chassis into discrete elements originally provided thereon, separating a software component into two or more sections and executing each on a separate processor core, etc. Also, it is appreciated that particular implementations of hardware and/or software components are merely illustrative, and other combinations of hardware and/or software that perform the methods described herein are within the scope of the disclosure.

It is appreciated that implementations of methods detailed herein are exemplary in nature, and are thus understood as capable of being implemented in a corresponding device. Likewise, it is appreciated that implementations of devices detailed herein are understood as capable of being implemented as a corresponding method. It is thus understood that a device corresponding to a method detailed herein may include one or more components configured to perform each aspect of the related method.

All acronyms defined in the above description additionally hold in all claims included herein.

While the disclosure has been particularly shown and described with reference to specific embodiments, it should be understood by those skilled in the art that various changes in form and detail may be made therein without departing from the spirit and scope of the disclosure as defined by the appended claims. The scope of the disclosure is thus indicated by the appended claims and all changes which come within the meaning and range of equivalency of the claims are therefore intended to be embraced.

What is claimed is:

1. A light detection and ranging (LIDAR) system, comprising:

a LIDAR scanning mirror;

a processor configured to control the LIDAR scanning mirror;

a first position sensor configured to determine a first position of the LIDAR scanning mirror and a second position sensor configured to detect a second position of the LIDAR scanning mirror;

the processor configured to determine whether an eye-safety criterion is met based on the first position and the second position, and control light output of the LIDAR system based on whether the eye-safety criterion is met.

2. The LIDAR system of claim 1, wherein the eye-safety criterion is a time period between a timing of the first position sensor detecting the LIDAR scanning mirror in the first position and a timing of the second position sensor detecting the LIDAR scanning mirror in the second position.

3. The LIDAR system of claim 1, wherein the processor is configured to control the light output of the LIDAR system by turning off a light source of the LIDAR system.

4. The LIDAR system of claim 1, wherein the processor is configured to control the light output of the LIDAR system by turning off an optical amplifier of the LIDAR system.

5. The LIDAR system of claim 1, further comprising a plurality of light sources, wherein the processor is further configured to determine a number of light sources of the plurality of light sources emitting light within a predefined time period.

6. A light detection and ranging (LIDAR) system, comprising:

an optical amplifier to amplify light provided by a light source to generate output light of the LIDAR system having an output light power;

a processor configured to control the optical amplifier;

an electrical sensor configured to detect a current applied to the optical amplifier to control an amplification of the optical amplifier, wherein the detected current corresponds to the output light power; and an optical sensor configured to detect light comprising at least one light from the light source and the generated output light;

the processor configured to control the output light power of the output light based on the detected current and the detected light whether an eye-safety criterion is met.

7. The LIDAR system of claim 6, wherein the processor is configured to control the light output of the LIDAR system by turning off the light source.

8. The LIDAR system of claim 6, wherein the processor is configured to control the light output of the LIDAR system by turning off the optical amplifier.

9. The LIDAR system of claim 6, wherein the processor is further configured to perform a test procedure, the test procedure comprising:

increase the amplification of the optical amplifier over a predefined threshold value corresponding to an eye-safety criterion, trigger, within a predefined time period, the electrical sensor to detect a current and the optical sensor to detect a light, and determine a time period between a detection time of one of the electrical sensor or the optical sensor, and a turning off time instant of the light source.

10. The LIDAR system of claim 9, wherein the processor is configured to perform the test procedure at a predetermined timing, wherein the predetermined timing is one of: before initial operation, after a predetermined time period of inactivity, during powering up of the LIDAR system, and after preset time periods.

11. The LIDAR system of claim 6, wherein the processor is further configured to perform a test procedure, the test procedure comprising:

trigger, within a predefined time period, the electrical sensor to detect a current and the optical sensor to detect a light, continuously increase the amplification of the optical amplifier, and determine the electrical current and the light when the electrical sensor detects an electrical current and the optical sensor detects the light over a predefined threshold value corresponding to an eye-safety criterion, and determine a power difference based on a power corresponding to the detected electrical current and a power corresponding to the detected light.

12. The LIDAR system of claim 11, wherein the processor is configured to perform the test procedure at a predetermined timing, wherein the predetermined timing is one of: before initial operation, after a predetermined time period of inactivity, during powering up of the LIDAR system, and after preset time periods.

13. The LIDAR system of claim 6, wherein the processor is further configured to perform a test procedure, the test procedure comprising:

trigger, within a predefined time period, the electrical sensor to detect a current and the optical sensor to detect a light, continuously decrease a predefined threshold value corresponding to an eye-safety criterion, and determine the electrical current and the light when the electrical sensor detects an electrical current and the optical sensor detects the light over the predefined threshold value, and determine a power difference based on a power corresponding to the detected electrical current and a power corresponding to the detected light, or determine a time period between a detection time of one of the electrical sensor or the optical sensor, and a turning off time instant of the light source.

14. The LIDAR system of claim 13, wherein the processor is configured to perform the test procedure at a predetermined timing, wherein the predetermined timing is one of: before initial operation, after a predetermined time period of inactivity, during powering up of the LIDAR system, and after preset time periods.

15. The LIDAR system of claim 6, further comprising a plurality of light sources, wherein the processor is further configured to determine a number of light sources of the plurality of light sources emitting light within a predefined time period.

16. A non-transitory computer readable medium having instructions stored therein that, when executed by one or more processors, cause the one or more processors to determine sensor signals of:

at least a first position sensor detecting a first position of a LIDAR scanning component and a second position sensor detecting a second position of the LIDAR scanning component, and/or an electrical sensor configured to detect an electrical current applied to an optical amplifier of a LIDAR system that controls the amplification of the optical amplifier and/or an optical sensor configured to detect light including at least one of the light from a light source of the LIDAR system or generated output light of the LIDAR system;

compare the determined signals of the first and second sensors, the electrical and/or the optical sensors with a predefined threshold value corresponding to an eye safety criterion; and reduce a power of one or more components of the LIDAR system in case the determined signals exceed the predefined threshold value.

17. The non-transitory computer readable medium of claim 16, wherein the one or more components is an optical amplifier configured to amplify light provided by a light source and/or the LIDAR system.

18. The non-transitory computer readable medium of claim 16, further having instructions stored therein that, when executed by the one or more processors, cause the one or more processors to:

perform a test procedure independent from an operational state of the LIDAR system, wherein the test procedure comprises increasing of an input electrical current to the optical amplifier and/or increasing the input light to the optical sensor.

19. The non-transitory computer readable medium of claim 16, wherein reducing power of one or more components of the LIDAR system comprises a turning off of the one or more components.

20. The non-transitory computer readable medium of claim 16, further comprising instructions to perform a test procedure, the test procedure comprising:

increase the amplification of an optical amplifier over a predefined threshold value corresponding to an eye-safety criterion, trigger, within a predefined time period, the electrical sensor to detect a current and the optical sensor to detect a light, and determine a time period between a detection timing of one of the electrical sensor and the optical sensor, and a power reduction timing of the one or more components.

* * * * *